United States Patent [19]
Kirihata

[11] Patent Number: 5,978,291
[45] Date of Patent: Nov. 2, 1999

[54] SUB-BLOCK REDUNDANCY REPLACEMENT FOR A GIGA-BIT SCALE DRAM

[75] Inventor: Toshiaki Kirihata, Poughkeepsie, N.Y.

[73] Assignee: International Business Machines Corporation, Armonk, N.Y.

[21] Appl. No.: 09/163,583

[22] Filed: Sep. 30, 1998

[51] Int. Cl.$^6$ ..................................... G11C 7/00
[52] U.S. Cl. ............... 365/200; 365/189.08; 365/230.06; 365/210
[58] Field of Search ............................... 365/200, 189.05, 365/189.08, 230.06, 210, 225.5, 230.03, 196, 190

[56] References Cited

U.S. PATENT DOCUMENTS

| | | | |
|---|---|---|---|
| 4,727,516 | 2/1988 | Yoshida et al. | 365/200 |
| 5,179,536 | 1/1993 | Kasa et al. | 365/200 |
| 5,270,975 | 12/1993 | McAdams | 365/200 |
| 5,270,976 | 12/1993 | Tran | 365/200 |
| 5,295,101 | 3/1994 | Stephen et al. | 365/200 |
| 5,430,679 | 7/1995 | Hiltebeitel et al. | 365/200 |
| 5,446,692 | 8/1995 | Haraguchi et al. | 365/200 |
| 5,459,690 | 10/1995 | Rieger et al. | 365/200 |
| 5,469,388 | 11/1995 | Park | 365/200 |
| 5,475,648 | 12/1995 | Fujiwara | 365/230.06 |
| 5,487,039 | 1/1996 | Sukegawa | 365/200 |
| 5,491,664 | 2/1996 | Phelan | 365/200 |
| 5,523,975 | 6/1996 | Reddy | 365/200 |
| 5,528,539 | 6/1996 | Ong et al. | 365/200 |
| 5,687,125 | 11/1997 | Kikuchi | 365/200 |

OTHER PUBLICATIONS

Kalter, et al. "A 50–ns 16–Mb DRAM with a 10–ns Data Rate and On–Chip ECC" IEEE Jrl. of Solid–State Circuits, V. 25, #5, Oct. 1990, pp. 1118–1128.

Kirihata, et al. "A 14–ns 4–Mb CMOS DRAM with 300–mW Active Power" IEEE Jrl. of Solid–State Circuits, V. 27, #9, Sep. 1992, pp. 1222–1228.

Kitsukawa, et al. "257–Mb DRAM Circuit Technologies for File Applications" IEEE Jrl. of Solid State Circuits, V. 28. Nov. 1993, pp. 1105–1113.

Sugibayashi, et al. "A 30–ns 256–Mb DRAM with a Multidivided Array Structure" IEEE Jrl. of Solid State Circuits, V. 28, #11 Nov. 1993, pp. 1092–1096.

Kirihata, et al. "Fault–Tolerant Designs for 256 Mb DRAM" IEEE Jrl. of Solid State Circuits, V. 31, #4, Apr. 1996, pp. 558–566.

Yoo, et al. "A 32–Bank 1 Gb Self–Strobing Synchronous DRAM with 1 Gbyte/s Bandwidth" IEEE Jr. of Solid State Circuits, V. 31, #11, Nov. 1996, pp. 1635–1643.

*Primary Examiner*—David Nelms
*Assistant Examiner*—Thong Le
*Attorney, Agent, or Firm*—H. Daniel Schnurmann

[57] ABSTRACT

A sub-block redundancy replacement memory configuration for repairing a plurality of faulty memory arrays, each consisting of a plurality of memory cells arranged in a first matrix formation, supported by first row decoders and first sense amplifiers, by combining at least two with at most n–1 out n sub-block redundancy arrays, each consisting of a plurality of redundancy memory arrays arranged in a second matrix, and supported by second row decoders and second sense amplifiers. Since additional sub-block redundancy arrays are available, it is possible to repair a defective memory array even if one or more block faults are present in the memory. The number of cells in the redundancy arrays is less than the number of cells in the memory arrays, substantially reducing the silicon overhead. Optionally, the sub-block redundancy memory arrays are distributed within at least two units, each consisting of a plurality of memory arrays, at least one sub-block redundancy array and corresponding columns decoders. The columns decoders are activated as a result of a redundancy match detection which determines whether a memory array or a sub-block redundancy memory array in any unit is activated.

28 Claims, 12 Drawing Sheets

○ GOOD ELEMENT (GOOD REDUNDANCY ELEMENT RE)
× DEFECTIVE ELEMENT
⎡ UNIT: ELEMENTS REPLACED WITH REDUNDANCY UNIT (RU CONTAINING 2REs)
⎣ SIMULTANEOUSLY

SUB-ARRAY15
(GOOD SUB-ARRAY)

SUB-ARRAY14
(DEFECTIVE SUB-ARRAY)

WHOLE OF THE SUB-ARRAY REPLACED WITH BLOCK REDUNDANCY

SUB-ARRAY1
(GOOD SUB-ARRAY)

SUB-ARRAY0
(GOOD SUB-ARRAY)

BLOCK REDUNDANCY
(GOOD SUB-ARRAY:
　　　　NO FAULT)

BLOCK REDUNDANCY MUST BE PERFECT!

AT LEAST 2 AND AT MOST n-1 OUT OF n SBRs CAN REPLACE THE DEFECTIVE ARRAY BLOCK

SUB-BLOCK REDUNDANCY REPLACEMENT FOR A GIGA-BIT SCALE DRAM

FIELD OF THE INVENTION

This invention generally relates to a redundancy replacement architecture for memory devices, and more particularly, to a sub-block redundancy replacement configuration applicable to large scale DRAMs.

BACKGROUND OF THE INVENTION

CMOS technology has evolved such that the computer market has rapidly opened to a wide range of consumers. Today multi-media requires at least a 16 MB and preferably even a 32 MB memory, which increases the relative cost of the memory system within a computer. In the near future, it is likely that 64 MB and 128 MB computers will become commonplace, which suggests a potential demand for 256 Mb DRAMs (Dynamic Random Access Memory) and beyond. Still in the development stage, DRAMs in the Gigabit range are already under way, which necessitate the introduction of new techniques that guarantee the repairability of the product notwithstanding the added complexity of the design and manufacture of such memory devices. Despite the huge array size and lithographic difficulties that ensue, it is more important than ever to increase the chip yield. Process engineers are continuously attempting to reduce and, ultimately, eliminate mask defects. Faults that inevitably remain in the chip are generally overcome using special circuit designs, and, more specifically, redundancy replacement.

Conventional redundancy configurations typically employ a Fixed Domain Redundancy Replacement (FDRR) architecture, wherein redundancy elements are used to replace defective elements within a fixed size domain for each row and column redundancy.

A typical redundancy architecture commonly used for low density DRAMs is shown in FIG. 1a. Therein are depicted a plurality of spares that are used for replacing defective elements within the domain, and which are appended to each sub-array comprising the memory. Each redundancy unit (RU) includes a small number of redundancy elements (RE), (e.g., two REs per RU are illustrated herein), which are used to repair existing faults (labeled X) within the corresponding sub-array. This arrangement, labeled intra-block replacement, expands the redundancy area overhead as the number of sub-arrays increases for high density memories, since each sub-array encompasses a domain for replacement purposes, and the domains in different sub-arrays are mutually exclusive of each other. This requires at least one or, preferably, two RUs in each sub-array. Thus, the efficiency of the RUs is rather poor in view of its inflexibility. This reduces the chip yield substantially when faults are clustered in a given sub-array. The above-mentioned concept is embodied in a configuration described in an article by T. Kirihata et al., entitled "A 14 ns 4 Mb DRAM with 300 mW Active Power", published in the IEEE Journal of Solid State Circuits, Vol. 27, No. 9, pp. 1222–1228, September 1992.

A second redundancy architecture, known as flexible redundancy replacement configuration is shown in FIG. 1b, wherein a memory is depicted having a single array as a large domain of RUs to selectively replace failing elements anywhere in the memory. In this configuration, REs within the RU repair faults (labeled X) located in any sub-array within the memory. The advantage of this arrangement over the previously described intra-block replacement is that one section, namely, a redundancy array, having a certain number of RUs may advantageously be used to service any number of sub-arrays forming the memory. This translates into a significant saving of real estate over the previous scheme, although it requires a substantial amount of added control circuitry to properly service all the sub-arrays forming the memory.

More details regarding the above configurations and the various trade-off may be found in an article by T. Kirihata et al., "Fault-Tolerant Designs for 256 Mb DRAMs", published in the IEEE Journal of Solid-state Circuits, Vol. 31, No. 4, pp. 588–566, April 1996; in an article by T. Sugibayashi et al., "A 30 ns 256 Mb DRAM with Multi-divided Array Structure", published in the IEEE Journal of Solid State Circuits, Vol. 28, No. 11, pp. 1092–1098, November 1993; and in an article by H. L. Kalter et al., "A 50 ns 16 Mb DRAM with a 10 ns Data Rate and On-Chip ECC", published in the IEEE Journal of Solid State Circuits, Vol. 25, No. 5, pp. 1118–1128, October 1990.

Regardless of the intra-block replacement arrangement shown in FIG. 1a and the flexible redundancy replacement configuration illustrated in FIG. 1b, they all use wordlines or bitlines as line redundancy. Therefore, the repairability is limited to relatively small faults, such as single bit faults, wordline faults or bitline faults. Although the flexible redundancy replacement can repair somewhat larger faults, a line redundancy replacement, even with its added flexibility, finds it difficult to repair block faults when a memory block contains in excess of 1 Mb cells, as for instance, in a 256 Mb DRAM, that renders the memory device totally inoperative.

Accordingly, a third redundancy architecture has been advanced, known as a block redundancy replacement configuration and shown in FIG. 1c, wherein a block redundancy completely replaces a defective memory block. A memory block is defined as an entire memory region supported by wordline drivers and sense amplifiers. By way of example, and with reference to FIG. 1d, a 256 Mb DRAM chip (100) is shown containing sixteen 16 Mb units (105). Each unit (105) consists of sixteen 1 Mb block (110), each with a 1 Mb array (120), a sense amplifier block SA (130), and a row decoder block RDEC (140). Each 16 Mb unit (105) is also provided with one 1 Mb block redundancy (115). The advantage of this arrangement over previously described ones related to line redundancy replacement is that a block fault (i.e., 110-i, i being an integer larger or equal to 0), typically caused by the wordline driver or by a sense amplifier, can be repaired by replacing it with a block redundancy (115). A power-bus fault can also be repaired by isolating the defective block from the power-bus by replacing it with a redundancy block. As the DRAM density increases, the probability of block faults also occurring increases, an obvious yield detractor for 256 Mb DRAMs and beyond. A fuller description of a block redundancy replacement is described in an article by G. Kitsukawa et al., entitled "256-Mb DRAM Circuit Technologies for File Applications", published in the IEEE Journal of Solid State Circuits, Vol. 28, pp. 1105–1113, November 1993.

In spite of its advantages, Kitsukawa's block redundancy replacement suffers in at least one aspect, namely, it imposes a substantial penalty for its implementation. The size of a redundancy block must be equal or larger than the array block, otherwise its repairability is poor since the majority of block faults are caused by a defective wordline driver, sense amplifier, or power bus. The area penalty of the block redundancy is over 6% for the 256 Mb DRAM, assuming a conventional implementation having one 1 Mb block redundancy for each 16 Mb unit (intra-unit block redundancy).

Designing redundancy blocks in a peripheral region (shared block redundancy) allows a redundancy block to be shared among others. However, added column circuitry for the redundancy block is required, which is oftentimes difficult to implement. It also increases the complexity of the wiring for the flexible block replacement, resulting in lower speeds. A detailed embodiment of shared block redundancy is discussed in an article by J. H. Yoo et al., entitled "A 32-Bank 1 Gb DRAM with 1 Gb/s Bandwidth", and published in the IEEE Journal of Solid State Circuits, Vol. 31, pp. 1635–1644, November 1996. Using column circuitry in both the normal block and the redundancy block significantly reduces the design overhead, as was the case for Kitsukawa's block redundancy replacement. Regardless, in Kitsukawa's intra-unit block redundancy and Yoo's shared block redundancy, the defective redundancy block (110-2) cannot be used even if it only contains a single fault (160). The probability of having a fault within a redundancy block is significant, reducing the effectiveness of the block redundancy. Introducing line redundancy repair means for the block redundancy element can overcome the problem; however, it requires a two-step redundancy programming, in which a redundancy block is first repaired and then having the block redundancy repair the defective block. The detailed embodiment of a two step block redundancy with variable size redundancy architecture is discussed in the article by T. Kirihata et. al., entitled "Variable Size Redundancy Replacement Architecture to Make a Memory Fault-Tolerant", filed in an U.S. patent application, Ser. No. 08/825,949 (Attorney docket FI9-97-002), in April 1997.

Other redundancy replacement configurations, including some related to the categories listed above, are described in the following references:

U.S. Pat. No. 5,491,664 to Phelan, issued Feb. 13, 1996, describes the implementation of a flexible redundancy memory block elements in a divided array architecture scheme. This configuration has both, the memory and redundancy memory blocks, coupled to a read bus to allow the redundancy memory in one memory sub-array to be shared by a second sub-array.

U.S. Pat. No. 5,475,648 to Fujiwara, issued Dec. 12, 1995, in which a memory having a redundancy configuration is described such that when an appropriate address signal agrees with the address of a defective cell, a spare cell provided by the redundant configuration is activated to replace the failing one.

U.S. Pat. No. 5,461,587 to Seung-Cheol Oh, issued Oct. 24, 1995, in which a row redundancy circuit is used in conjunction with two other spare row decoders, wherein by a judicious use of fuse boxes, signals generated by a row redundancy control circuit, make it possible to replace failing rows with spare ones.

U.S. Pat. No. 5,459,690 to Rieger at al., issued Oct. 17, 1995, describes a memory with a redundant arrangement that, in the presence of normal wordlines servicing defective memory cells, enables faulty memory cells to be replaced with redundant cells.

U.S. Pat. No. 5,430,679 to Hiltebeitel et al., issued Jul. 4, 1995, describes a fuse download system for programming decoders for redundancy purposes. The fuse sets can be dynamically assigned to the redundant decoders, allowing a multi-dimensional assignment of faulty rows/columns within the memory.

U.S. Pat. No. 5,295,101 to Stephens, Jr. et al., issued Mar. 15, 1994, describes a two level redundancy arrangement for replacing faulty sub-arrays with appropriate redundancy elements.

Whereas the prior art and previous discussions have been described mainly in terms of DRAMs, practitioners of the art will fully appreciate that the above configurations and/or architectures are equally applicable to other types of memories, such as SRAMs, ROMs, EPROMs, EEPROMs, Flash RAMs, CAMs, and the like.

OBJECTS OF THE INVENTION

Accordingly, it is an object of the present invention to make a memory fault tolerant even in the presence of one or more block faults in the memory.

It is another object of the invention to use a sub-block redundancy replacement arrangement to selectively replace faulty blocks.

It is a further object of the invention to combine at least 2 and at most n−1 out n sub-block redundancies, such that in the presence of n additional sub-block redundancies, a faulty block can be repaired when the number of sub-block redundancies that contain a fault.

It is still another object of the invention to provide a redundancy replacement arrangement such that selected column circuitry is activated when sub-block redundancies in a first unit repairs a faulty block in a second unit, thereby making it possible to share column circuitry regardless of the mode the memory device operates in, whether in a normal mode or a sub-block redundancy mode.

It is yet another object of the invention to eliminate the need for a two step redundancy replacement to simplify testing and the implementation of the redundancy algorithm.

SUMMARY OF THE INVENTION

In a first aspect of the invention, a sub-block redundancy replacement arrangement repairs a faulty block by combining at least two and at most n−1 out n sub-block redundancies, where n is an integer $\geq 3$. Since there is provided at least one additional sub-block redundancy, it is possible to repair a faulty block even if a number of sub-block redundancies contain faults.

In another aspect of the invention, there is provided a memory device that includes: a plurality of primary memory arrays, each having a plurality of memory cells arranged in a first matrix formation, wherein rows and columns of the first matrix are coupled to first row decoders and first sense amplifiers; n redundancy memory arrays, each having a plurality of redundancy memory cells arranged in a second matrix formation, wherein rows and columns of the second matrix are coupled to second row decoders and second sense amplifiers; and means for replacing a defective one of the primary memory arrays with at least 2 and at most n−1 of the n redundancy memory arrays.

All sub-block redundancies hereby desribed are, preferably, positioned at the bottom of two or more units to reduce the area overhead. Column circuitry at the bottom of unit can be shared between the normal array and the sub-block redundancies. When the sub-block redundancies in a different unit need to be used, the column circuitry is appropriately switched by the sub-block redundancy control circuitry.

BRIEF DESCRIPTION OF THE DRAWINGS

The above-mentioned objects, aspects and advantages of this invention and the manner of attaining them will become more apparent and the invention itself will be better understood when the detailed description of the embodiment of the invention is taken in conjunction with the accompanying drawings, the description of which follows.

DETAILED DESCRIPTION OF PREFERRED EMBODIMENTS

Figure 1A:
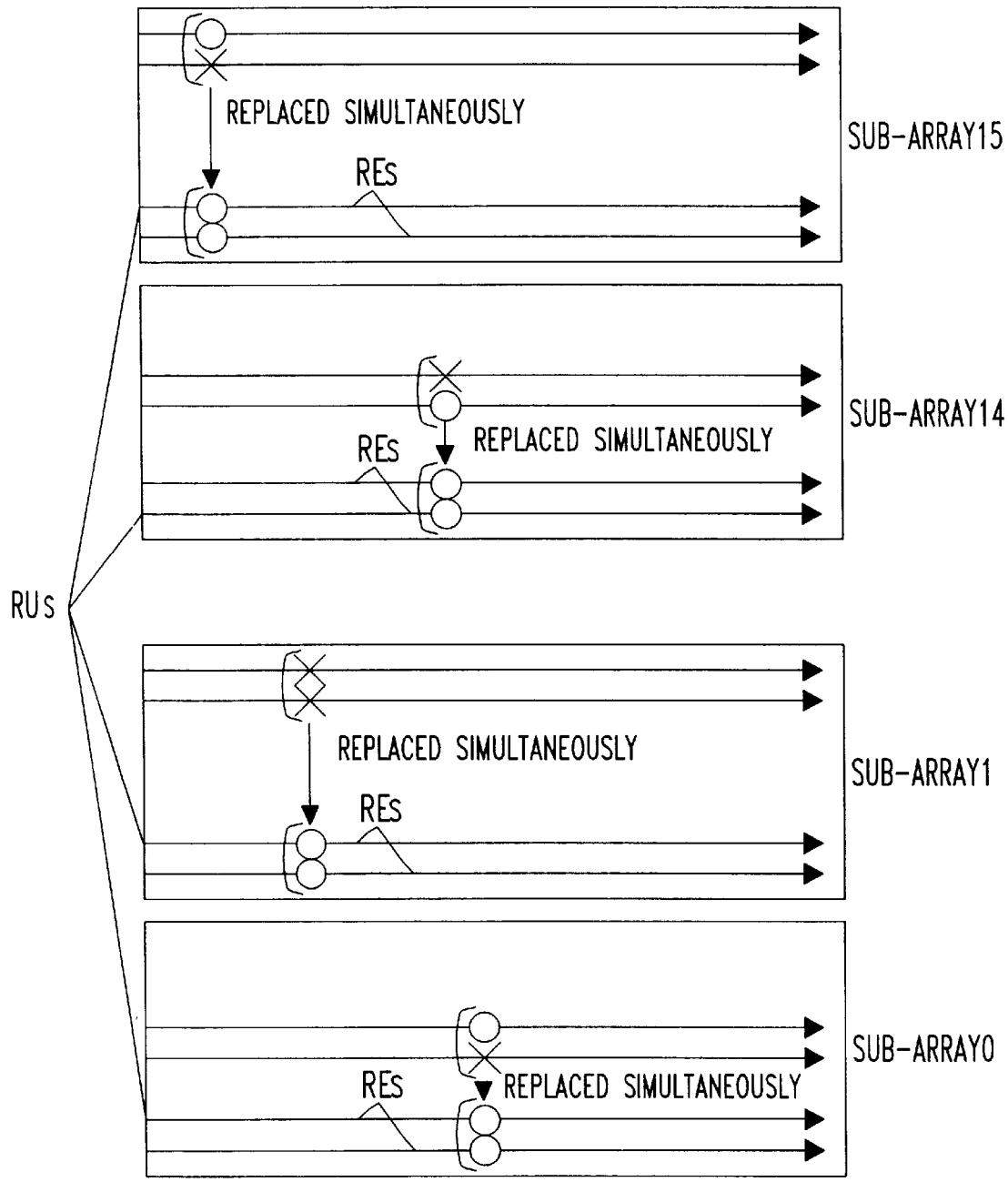
FIG. 1(a) shows a schematic representation of a prior art memory provided with an FDRR intra-block replacement scheme, and showing how failing rows in the various sections of the memory are corrected with REs replacing failing ones in each corresponding section.
Figure 1B:
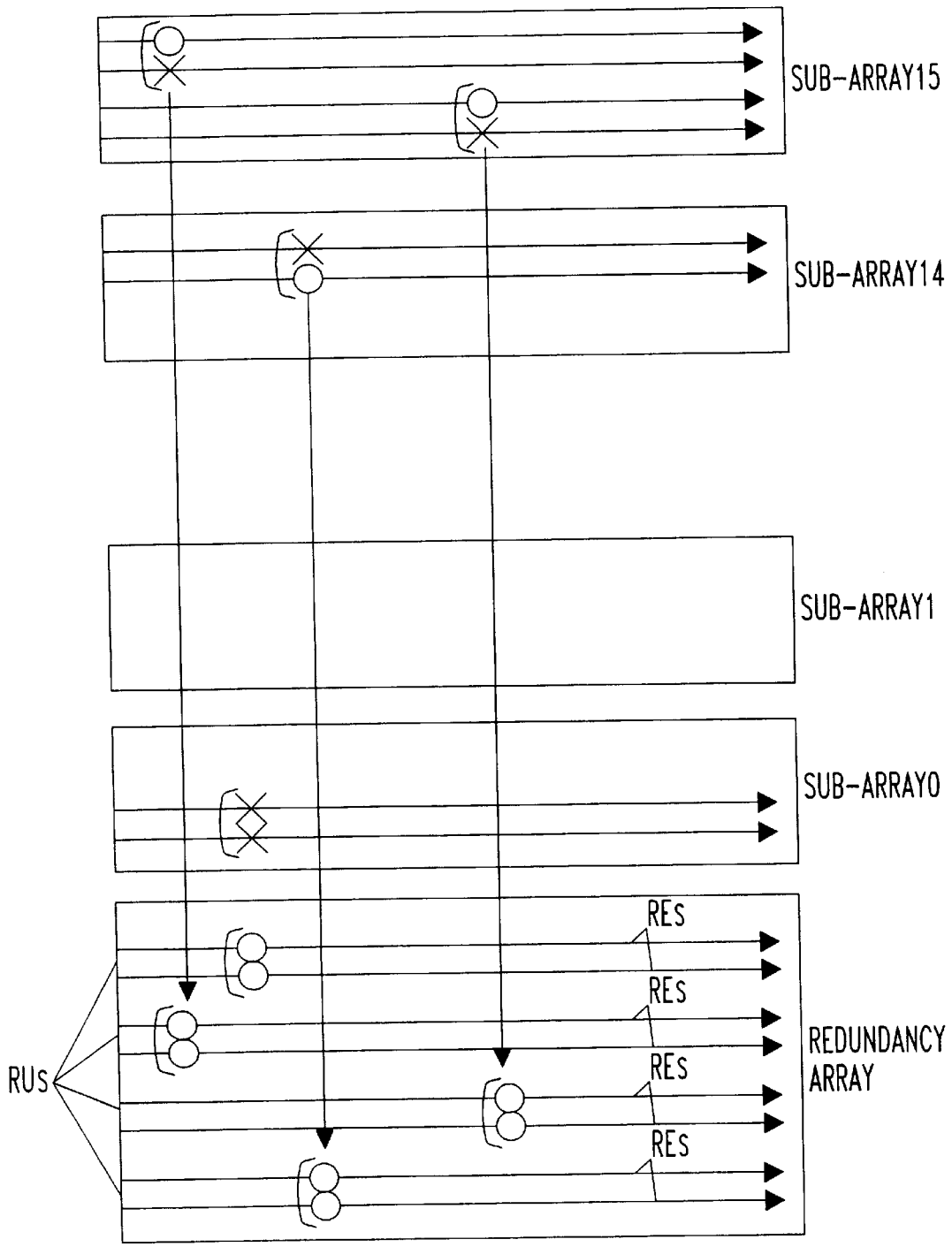
FIG. 1(b) shows a schematic diagram of a prior art memory provided with an FDRR flexible redundancy replacement scheme, wherein an array of REs clustered at one end of the memory is used to selectively replace failing rows anywhere in the memory.
Figure 1C:
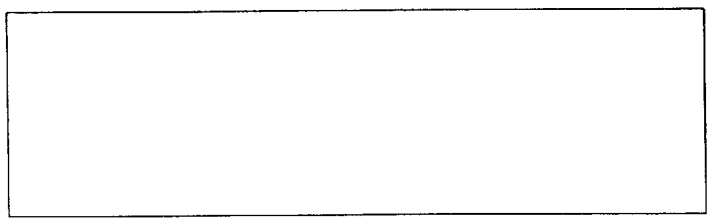
FIG. 1(c) shows a schematic diagram of a prior art memory provided with a redundancy block replacement scheme, wherein a redundancy memory block replaces a defective memory block.
Figure 1C:
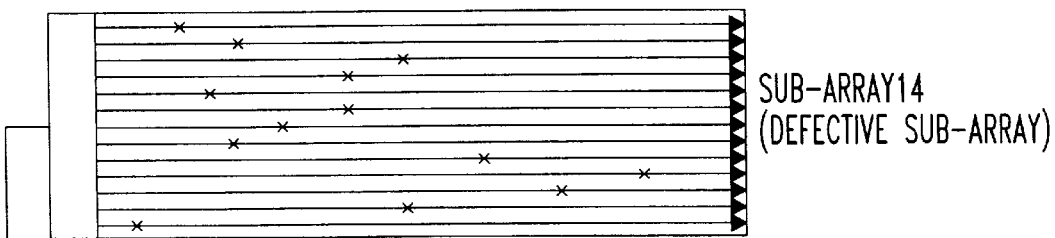
Figure 1C:
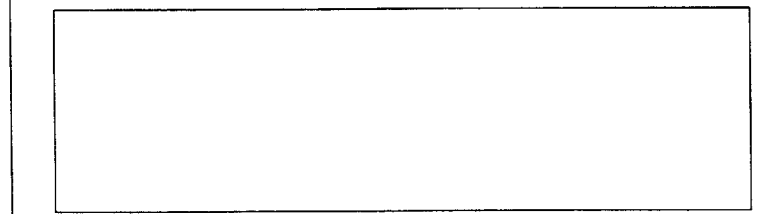
Figure 1C:
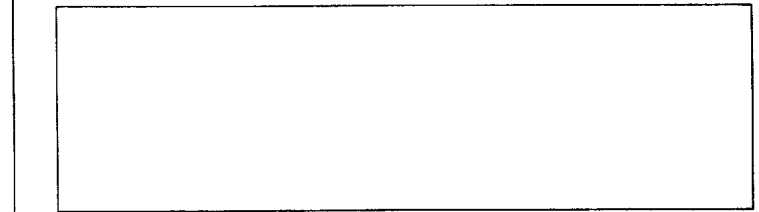
Figure 1C:
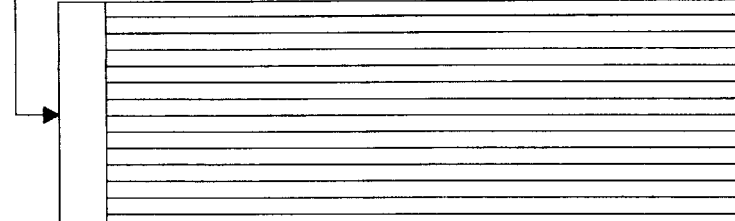
Figure 1D:
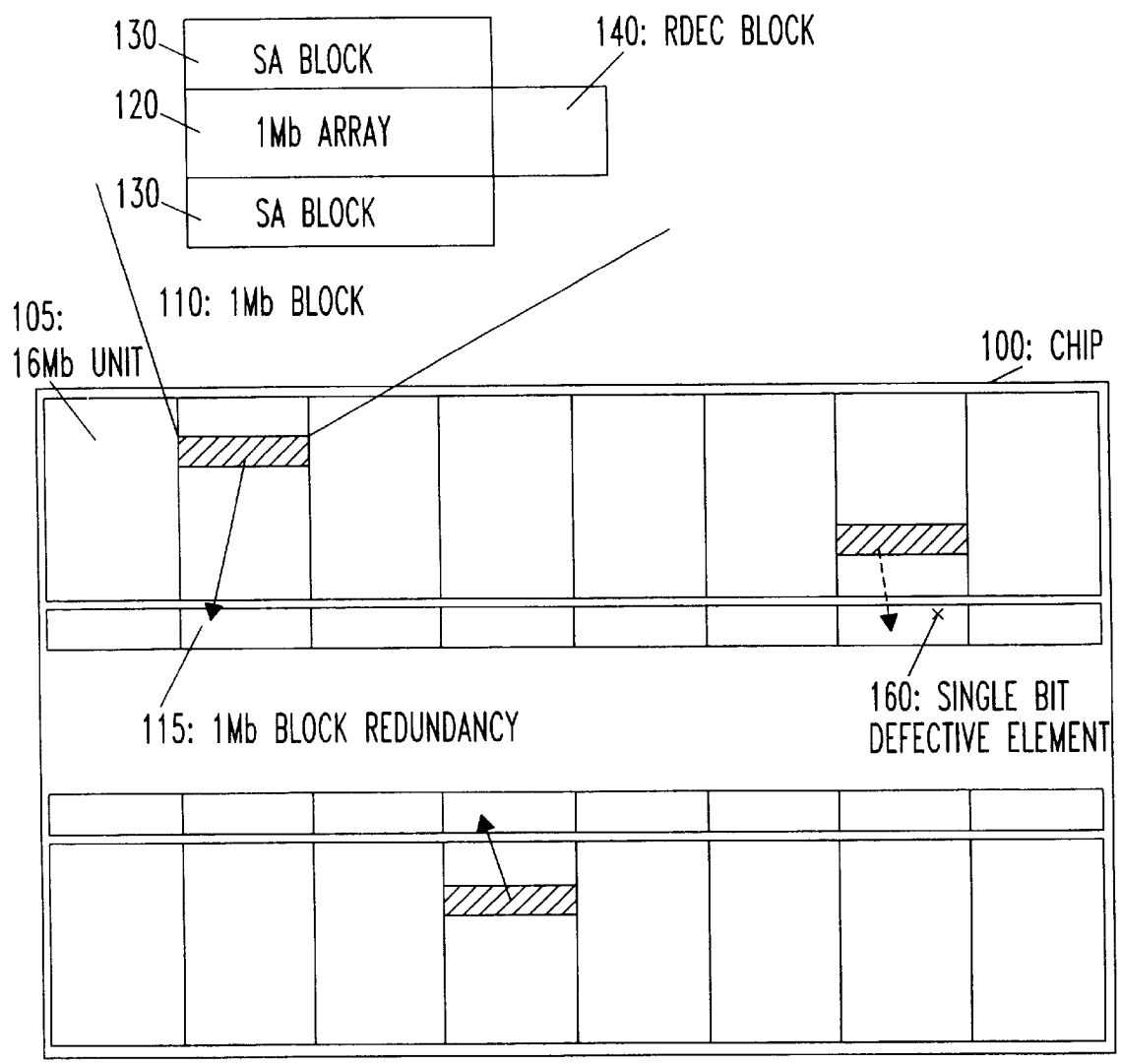
FIG. 1(d) shows a prior art 256 Mb DRAM chip having sixteen 16 Mb units, each unit containing sixteen 1 Mb blocks, each block including a 1 Mb array, a sense amplifier, and a row decoder. Each 16 Mb unit is also provided with one 1 Mb block redundancy such that a block fault can be repaired by replacing it with a block redundancy.
Figure 2:
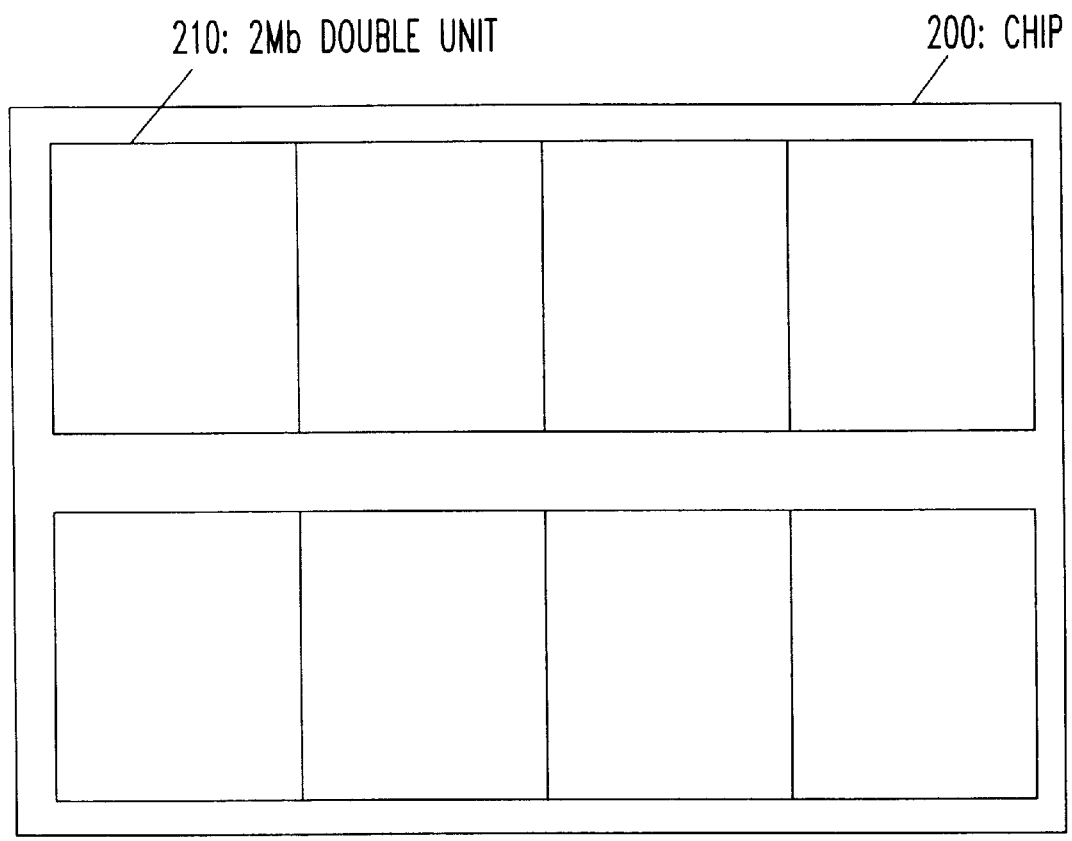
FIG. 2 illustrates a schematic box diagram of a conventional memory array consisting of eight double units.

Referring now to FIG. 2, a schematic diagram of a 256 Mb DRAM chip is shown that illustrates the implementation of the sub-block redundancy replacement configuration. For illustrative purposes, the 256 Mb DRAM chip (200) is shown consisting of eight 32 Mb double units (210), the details of which are described in more detail in FIG. 3.

Figure 3:
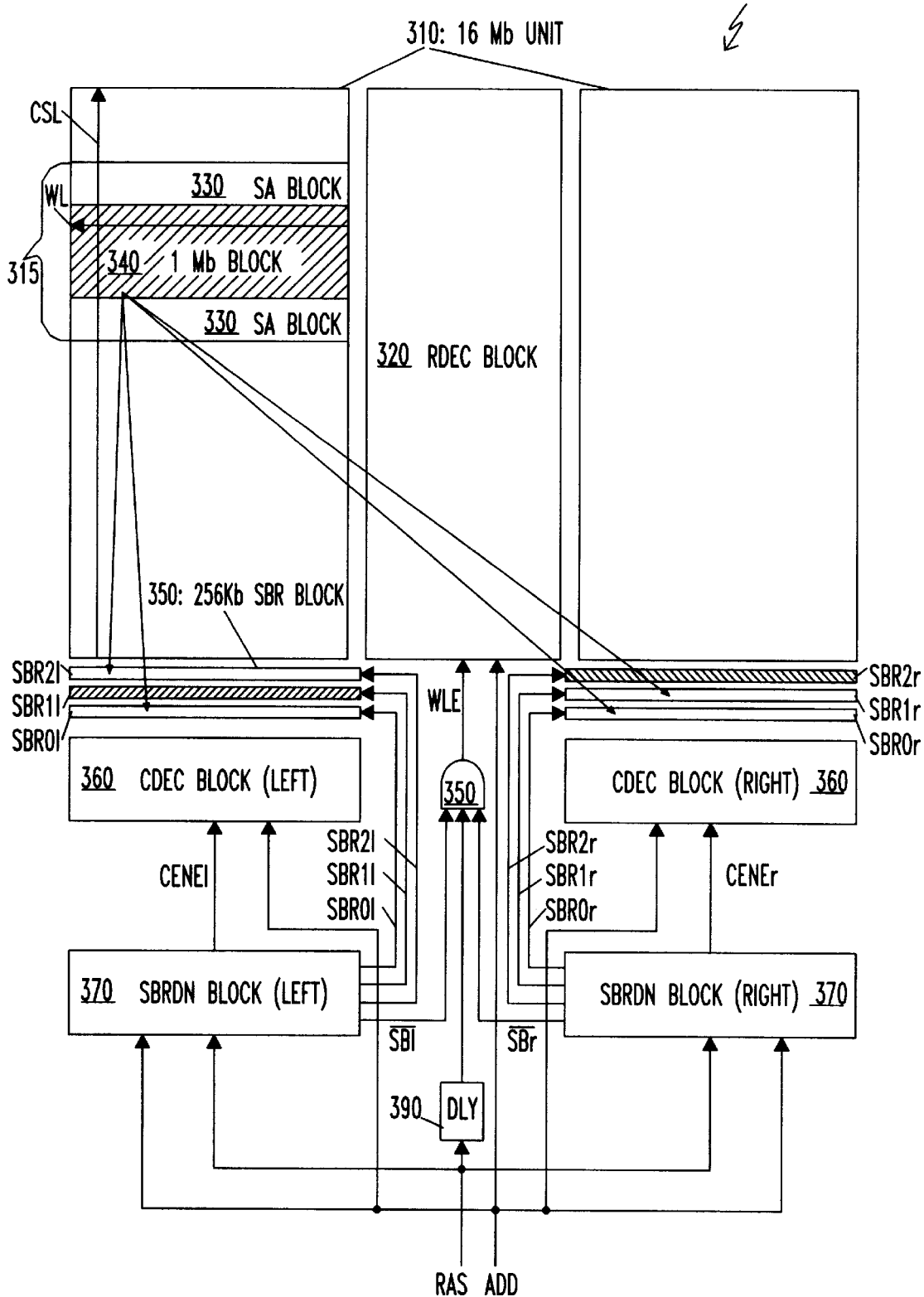
FIG. 3 is a schematic diagram of the detailed components forming either one of the double units shown in FIG. 2, in accordance with the invention.

FIG. 3 shows the detailed schematic of each 32 Mb double unit (210) within the IC memory chip (200). The 32 Mb-double unit (210) is sub-divided into two 16 Mb units (310) sharing row decoders RDEC (320). Each 16 Mb unit (310) consists of sixteen 1 Mb blocks (315), each of which consists of a 1 Mb array (340) provided with sense amplifiers SA (330). These sense amplifiers are advantageously shared between adjacent 1 Mb arrays in order to reduce area overhead. Three sub-block redundancy circuits SBR share the sense amplifiers SA (330). In order to reduce the area allocated to the redundancy sub-blocks, the 256 Kb SBR0-3 (350), column decoders CDEC (360), and appropriate sub-block redundancy circuits SBRDN (370) are, preferably, placed at the bottom of each 16 Mb unit (310). Each 1 Mb array (340) contains 512 wordlines (WL) placed horizontally and 2048 bitline pairs (BL) (not shown) positioned vertically. Additionally, each 256 Kb SBR block (350) consists of 128 redundancy wordlines RWLS. In summary, there are 16,384 WLs (512 WLs×16 1 Mb blocks×2 units) and 768 RWLs (128 RWLs×3 SBRs×2 units) in each 32 Mb double unit (210). For simplicity sake, it is assumed that only one of 16,384 WLs in 32 1 Mb arrays is activated when the memory operates in a normal mode, and only one out of 768 RWLs is activated when it is operating in a sub-block redundancy mode. Sub-block redundancy circuits (370) determine the (normal or redundancy) mode of operation by comparing address inputs ADD with pre-programmed address fuses. The detailed operation of this configuration in its normal mode of operation and when in a redundancy mode will be discussed next.

Normal Mode:

When a row address strobe signal RAS is enabled, both left and right SBRDN blocks (370) initiate a redundancy match detection, wherein address inputs ADD are compared with predetermined address fuses. When in normal mode, ADD does not match the predetermined address fuses. Sub-block redundancy enable signals SBR0-3*l* and SBR0-3*r* remain at a low, disabling the SBR blocks (350). [Note: the notation of, e.g., SBR2*l* and SBR2*r* refers to the circuits on the left (l) and on the right (r), respectively]. The signals $\overline{SBl}$ and $\overline{SBr}$ remain at a high binary value, keeping the WLE gate (380) ON. WLE gate (380) activates a signal WLE when a predetermined RAS signal, delayed by delay logic (390), switches to a high, following the value of signal RAS. WLE enables RDEC (320) to select one of 16,384 WLs within the 32 Mb double unit (210). The corresponding WL is then energized, first accessing the cell and then activating the corresponding sense amplifier SA (330). For column access operation, either 'left' or 'right' SBRDN block (370) activates the corresponding column enable signal, either CENEl or CENEr, respectively. When a word line WL in the left 16 Mb unit (310) is activated, the left SBRDN block (370) generates the signal CENEl enabling the left CDEC block (360). This results in a column select signal CSL being activated in the left array, allowing the cell data in the left 16 Mb unit (210) to be read or written, as it is conventionally done. When WL in the right 16 Mb unit (310) is activated, the right SBRDN (370) generates a signal CENEl, enabling the right CDEC block (360). This results in a column select signal CSL being generated in the right array, allowing cell data in the right 16 Mb unit (210) to be read or written, as done in common practice.

Redundancy Mode:

When a row address strobe signal RAS is enabled both, left and right SBRDN blocks (370) initiate a redundancy match detection, in which the address inputs ADD are compared with predetermined address fuses. When in redundancy mode, ADD matches the predetermined address fuses. Only one signal of SBR0-3*l* and SBR0-3*r* switch to a high, enabling the corresponding SBR (350). When the SBR block in the left unit detects the redundancy mode, signals $\overline{SBl}$ switch to a low, keeping signal $\overline{SBr}$ at a high. When SBR in the right unit detects a redundancy mode, signals $\overline{SBl}$ switches to a low, keeping signal $\overline{SBl}$ high. The switch of either signal $\overline{SBl}$ or signal $\overline{SBr}$ to a high disables gate WLE (380). WLE (380) cannot trigger signal WLE, even when a predetermined delayed RAS signal, delayed by delay logic (390), switches to a high, following the signal RAS. Keeping the signal WLE at a low level disables RDEC (320), inhibiting any WL within the 32 Mb double unit (210) from being selected. On the other hand, a signal SBR (i.e., SBR01) switching from a low to a high activates the corresponding sub-block redundancy SBR (i.e., SBR01). The corresponding RWL within the SBR (i.e., SBR01) is then activated to access the redundancy cell, energizing the corresponding SA (not shown). SBRDN (370) also activates the corresponding column enable signal, either CENEl or CENEr. When SBR (350) in the left unit is activated, SBRDN (370) on the left activates a signal CENEl, enabling CDEC (360) on the left. This results in triggering a column select signal CSL in the left array, allowing the cell data in the left 16 Mb unit (210) to be read or written, as it is done conventionally. When SBR (350) in the right unit is activated, the SBRDN (370) on the right triggers a signal CENEr, enabling the CDEC (360) on the right. It follows that column select signal CSL being activated in the right unit, allows the cell data in the right 16 Mb unit (210) to be read or written, as it is practiced conventionally.

Figure 4:
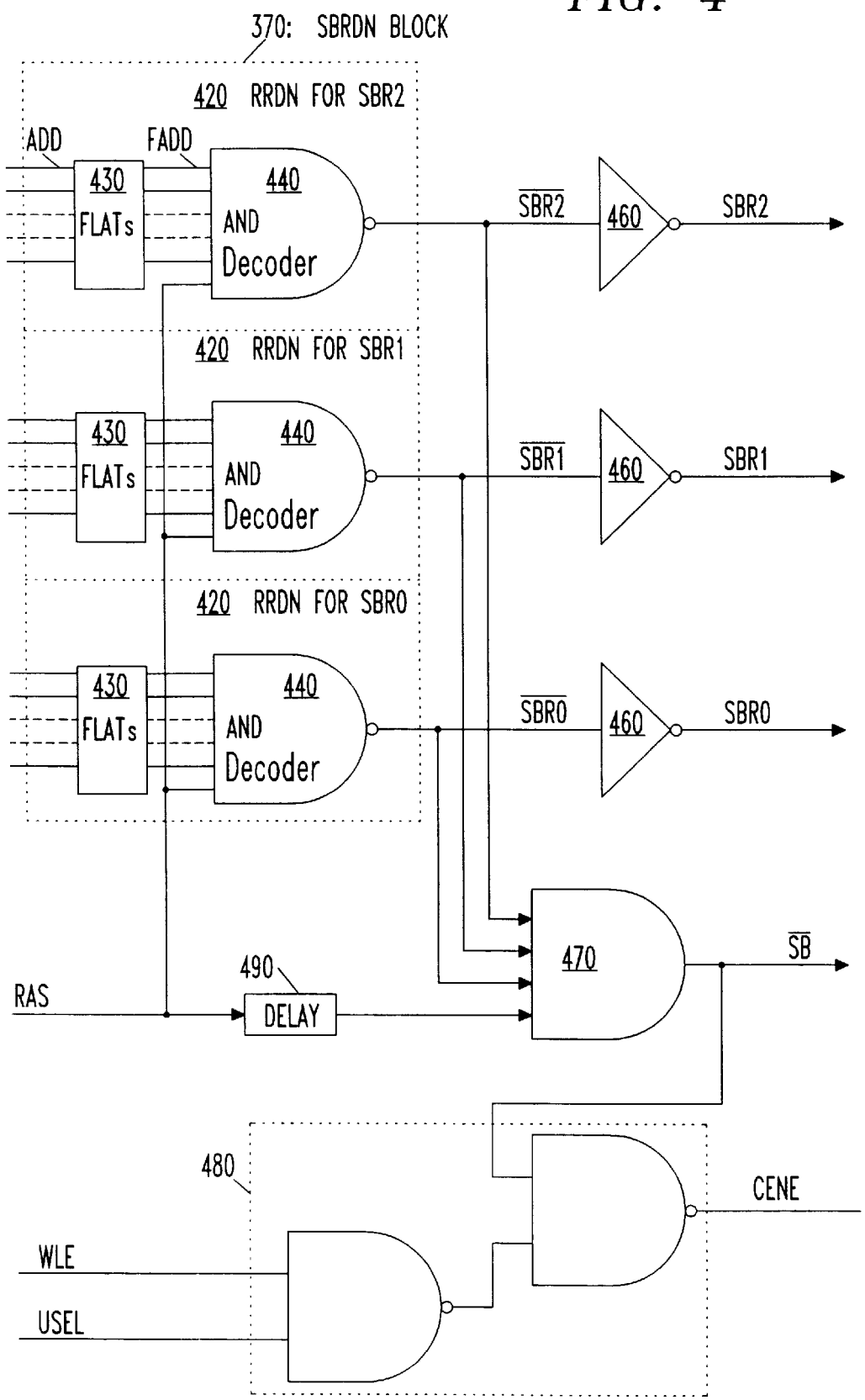
FIG. 4 is a schematic gate level diagram showing a sub-block redundancy circuitry, in accordance with the invention.

Referring now to FIG. 4, depicting a gate level representation of SBRDN (370), three row redundancy control circuits RRDN (420) are shown, each activating a corresponding 256 Kb sub-block redundancy SBR (350). Also depicted is a detailed schematic of $\overline{SB}$ gate (470) and CENE gate (480). Each RRDN (420) receives the signal RAS and address inputs ADD. Each address is compared with a pre-programmed fuse address in the corresponding fuse latch FLAT (430). (Note that one FLAT per address is required). When no match occurs, the output FADD remains at a low. If there is a match, FADD switches to a high. The detailed operation of the normal and redundancy modes will now be discussed.

Normal Mode:

When operating in normal mode, at least one FADD in each RRDN (420) remains at a low. AND decoder (440) in each RRDN keeps the corresponding signal $\overline{SBR}$ and SBR (inverted by invertor 460) at high and low levels, respectively, even when the signal RAS switches from a low to a high. $\overline{SB}$ gate (470) receives three signals $\overline{SBR0\text{-}2}$ from the three RRDNs (420). Because all $\overline{SBR0\text{-}2}$ bar remain at a high, the output $\overline{SB}$, likewise, will also remain at a high. CENE gate generates the signal CENE for column access operation in accordance with the right or left unit selection address USEL, and only when the signal WLE switches to a high.

Redundancy Mode:

The following discussion assumes that RRDN for SBR0 detects the presence of a redundancy mode, while the other two RRDNs (corresponding to SBR1 and SBR2) detect the presence of a normal mode. (Note, only one out of three RRDNs detects a redundancy mode). All FADDs in RRDN switch to a high, forcing the signal $\overline{SBR0}$ to a low and SBR0 to a high when the signal RAS rises. $\overline{SB}$ gate (470) receives the three signals SBR0-2 bar from the respective three $\overline{SBR0\text{-}2}$ RRDNS. Switching to a low forces signals $\overline{SBR0}$ and $\overline{SB}$ to a low. Falling signal $\overline{SB}$ (in FIG. 3) disables AND gate (380) without activating WLE. Since WLE remains at a low, CENE is controlled by $\overline{SB}$. (Note: In normal mode, WLE rises while $\overline{SB}$ remains at a high. Thus, CENE is controlled by USEL, as previously discussed). On the other hand, a falling signal SB activates the corresponding signal CENE for column operation.

Figure 5:
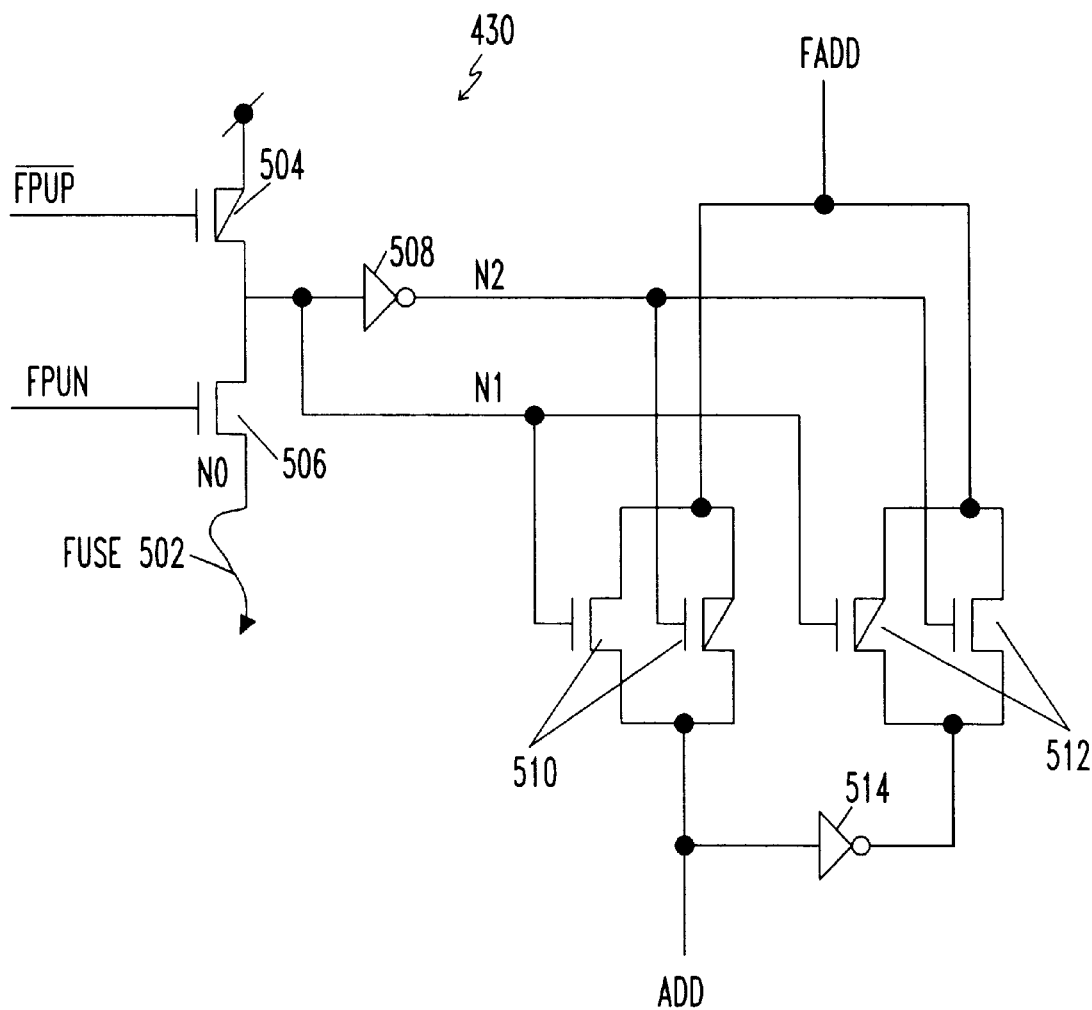
FIG. 5 is a schematic of a gate level fuse latch FLAT diagram.

FIG. 5 shows a gate level schematic of FLAT (430). When power is turned on, node N1 is pulled up by PMOS (504), both signals $\overline{FPUP}$ and FPUN being at a low. $\overline{FPUP}$ and FPUN then rise, disabling PMOS (504) and enabling NMOS (506). If fuse (502) is not blown, the node N1 discharges to a low. If fuse (502) is blown, node N1 remains at a high. The signal N1 and the signal N2, inverted by invertor (508), couple CMOS passing gates (510) and (512). When N1 is at a low and N2 at a high (i.e., the fuse is not blown) pass gate (512) opens, coupling the signal ADD inverted by inverter (514) to the output FADD. When N1 and N2 are at a high and low, respectively, (i.e., the fuse is blown), pass gate (510) opens, coupling the signal ADD to the output FADD. The output FADD polarity is determined by the signal ADD and by the pre-programmed state of the fuse, making it possible to effect a redundancy match detection. (Note: if the address fuse state is at binary 0, the fuse will not be blown; conversely, if it is at a 1, the fuse will be blown). Consequently, FADD switches to a high whenever ADD does match the state of the address fuse.

Figure 6:
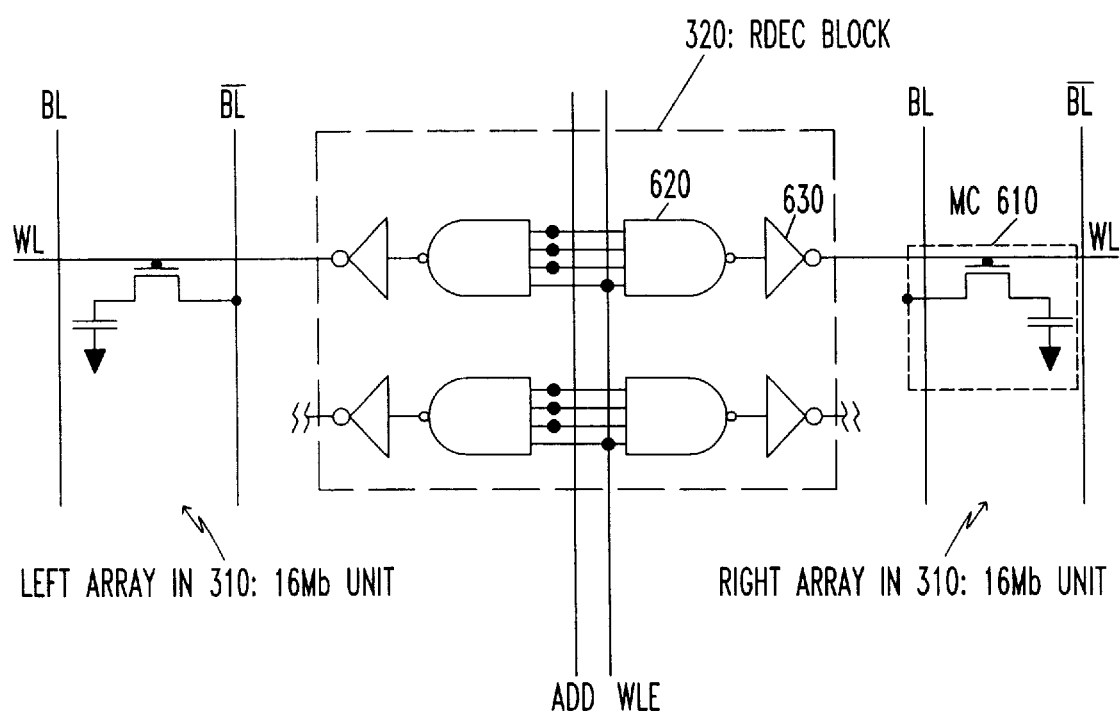
FIG. 6 shows a detailed schematic of a shared row decoder integral to the double unit.

FIG. 6 shows a detailed schematic of the row decoder RDEC (320) and the left and right arrays (310). RDEC consists of a plurality of decoders, each having an AND gate (620) and a WL driver (630). (Note that each RDEC has a unique address input combination like any conventional decoder). When the signal WLE switches to a high, the corresponding decoder is triggered, activating the corresponding WL. When the 2048 memory cells MC (610) coupled to the corresponding WL are simultaneously enabled, the cell data is transferred to the corresponding BLs, as it is done when the memory operates in a conventional read mode. When in a redundancy mode, the signal WLE remains at a low, inhibiting WL from being activated, regardless of the address inputs ADD.

Figure 7:
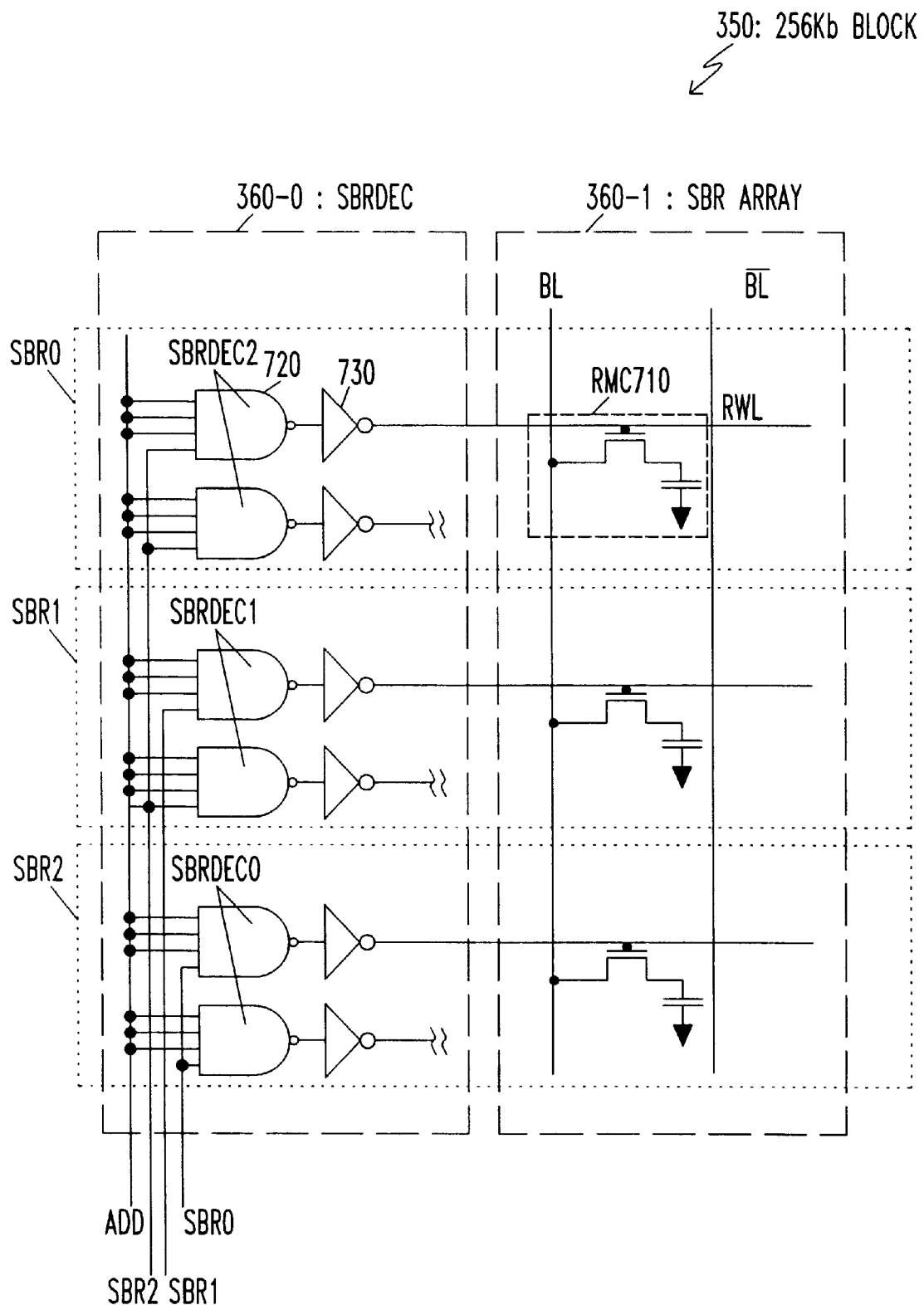
FIG. 7 illustrates a detailed schematic of sub-block redundancy circuits SBR0–SBR3, including a plurality of sub-block redundancy decoders SBRDEC.

FIG. 7 shows a detailed schematic of SBR0-3 (360), each consisting of 256 Kb sub-block redundancy array (360-1: SBR array), coupled to a plurality of sub-block redundancy decoders SBRDEC (360-0, . . . ). Each, in turn, consists of a NAND gate (720) and a driver (730). When in normal mode, all SBR0-2 signals remain at a low, inhibiting RWL from becoming active. In a redundancy mode, one of the signals SBR0-2 switches to a high, enabling one of the sub-blocks SBR0-2.

The following discussion assumes that SBR2 switches to a high. A rising SBR2 enables sub-block SBR2. Each decoder in block SBR2 has a unique unit address combination. This triggers the corresponding RWL when the signal SBR2 switches to a high.

Figure 8:
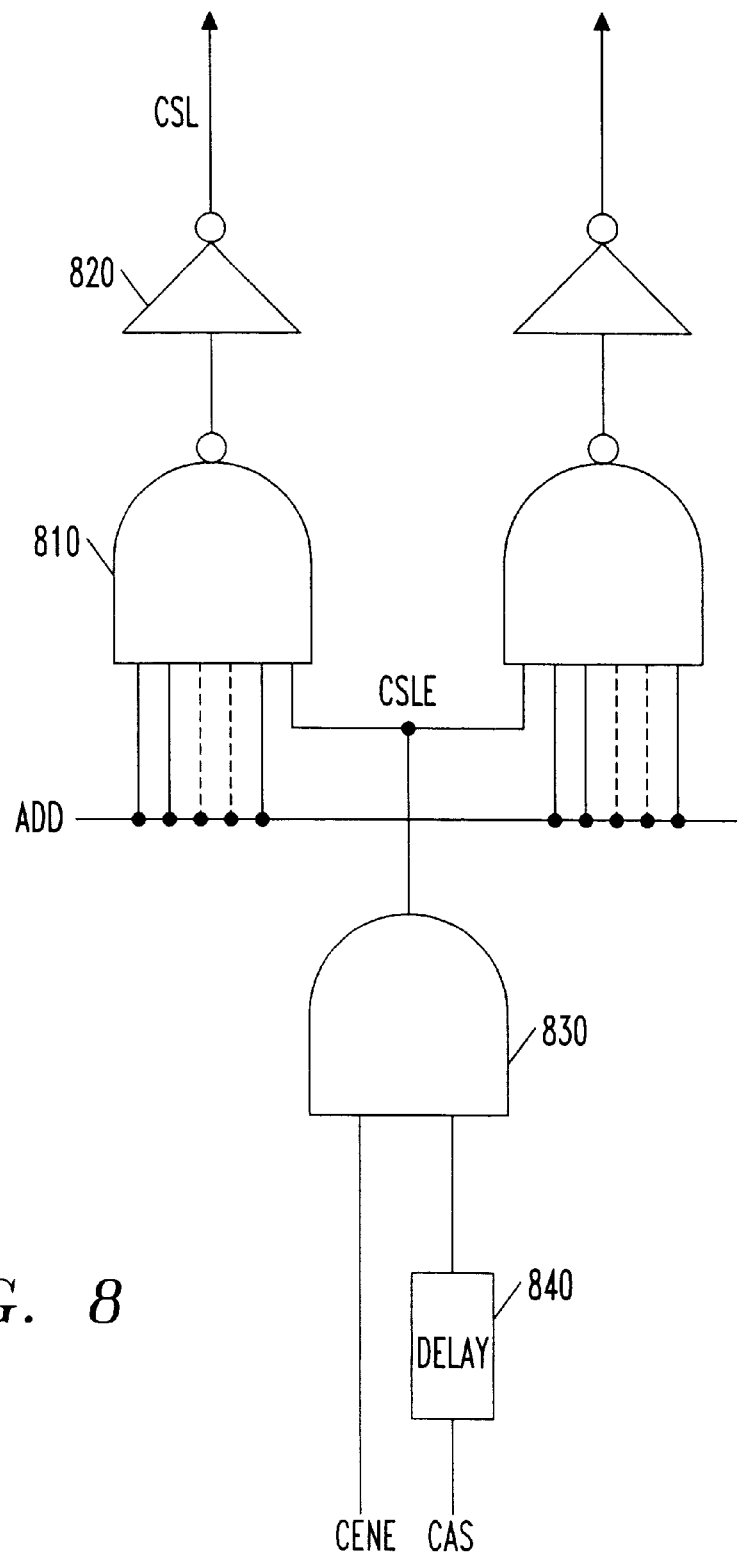
FIG. 8 illustrates a schematic gate level diagram of a column decoder CDEC block.

FIG. 8 shows a detailed diagram of the column decoders CDEC (360) illustrated in FIG. 3. Each consists of a NAND gate (810) and a CSL driver (820). As in any conventional decoder, each NAND gate input has a unique unit address combination. Signal CENE is controlled by a sub-block redundancy circuit (370 in FIG. 3) or, more specifically, by gate CENE (480 in FIG. 4). When row address strobe signal RAS (FIG. 3) is triggered, either left or right CENE switches to a high. Column address strobe signal CAS couples to the delay circuitry (440 in FIG. 4), enabling gate CSLE (830). The gate CSLE (830) is enabled when delayed input signal CAS switches to a high. Its output switches to a high only when the signals CENE and CAS stand at a high. This enables NAND gate (810) to trigger the corresponding CSL.

Any four out of six 256 Kb SBRs (350) can repair any faulted 1 Mb block (340) within the 32 Mb unit (210), allowing for the presence of up to two defective SBRs without losing repairability. The total number of redundant cells in one 16 Mb unit (310) is 256 Kb×3, which is less than those used for conventional block redundancy using 1 Mb cells.

Figure 9:
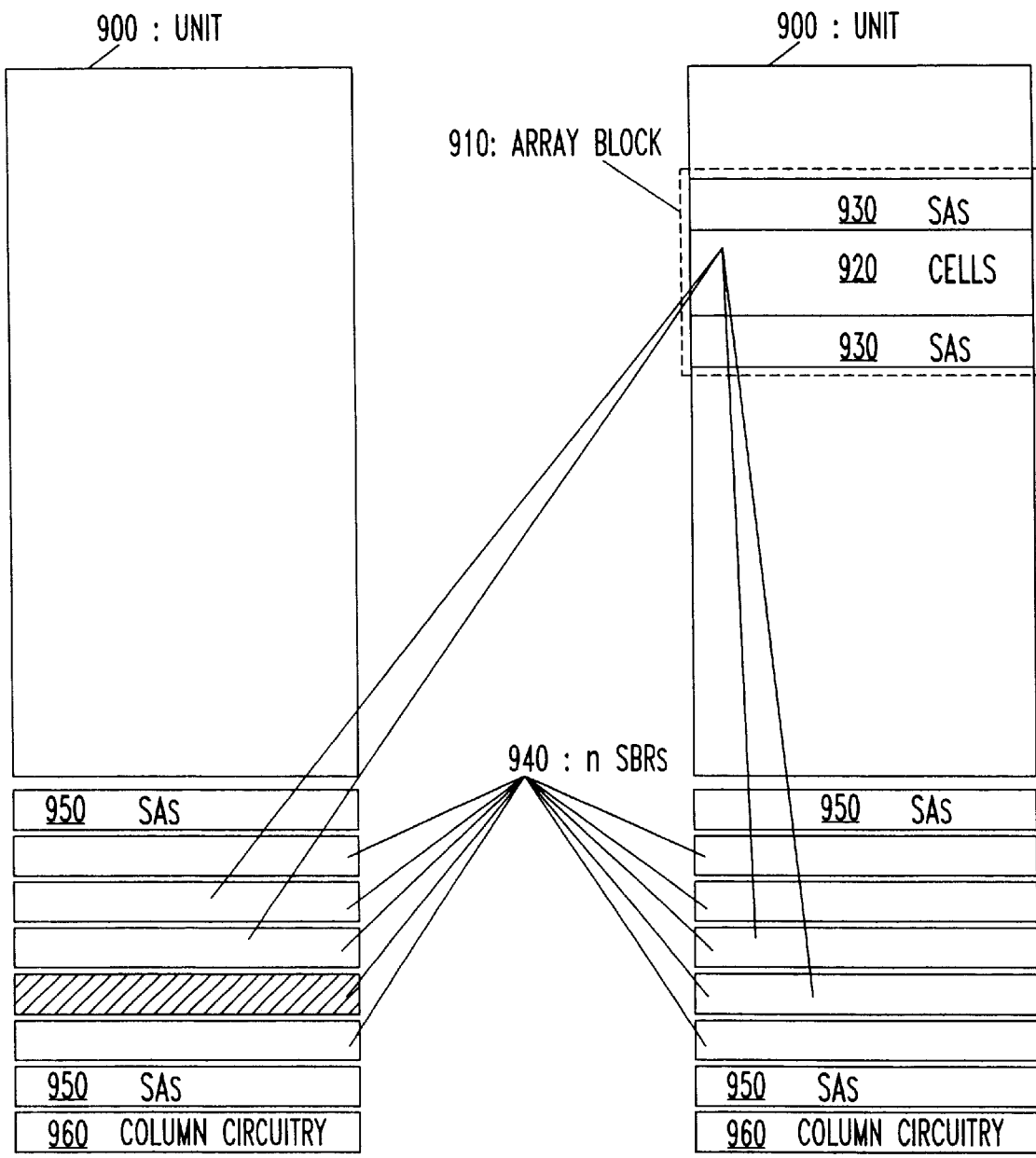
FIG. 9 illustrates a generalized example of the sub-block redundancy arrangement scheme.

FIG. 9 shows a more generalized example that expands the scope of the invention. The sub-block redundancy arrangement is organized in a plurality of units (900), each consisting of a plurality of array blocks (910). Each array block (910) consists of a plurality of cells (920) and sense amplifiers SA (930). Optionally, the array block (910) can also include row decoders (not shown). Additionally, a plurality of units is provided consisting of n redundant sub-arrays, each containing a plurality of redundant cells. The defective array block (910) can be replaced with at least 2 and at most n−1 out of n sub-block redundant sub-arrays. It is not necessary to allocate the redundant sub-arrays equally to each unit. Furthermore, the redundant sub-arrays are not necessarily of the same size. The invention does, however, require that at least 2 and at most n−1 redundant out of n sub-arrays be provided with more cells than the cells in the array block (910). Optionally, the invention extends to the instance where at least two combinations of two sub-redundancy blocks repair a defective array block consisting of a plurality of cells and sense amplifiers, while having at least one unused redundancy sub-array. The invention also includes the instance where sense amplifiers SA (950) are shared between a plurality of redundant sub-arrays while sharing the same column circuitry (960) with all array blocks (910) and redundancy sub-arrays (940) within each unit (900).

The invention has been described above with reference to a preferred embodiment. However, those skilled in the art will recognize that changes and modifications may be made in this preferred embodiment without departing from the scope of the present invention. For example, the above-described memory structures and configurations may be modified in accordance to requirements of the technology being used. Moreover, the specific modules and configurations, particular circuits, such as decoders, switching circuits, etc., and their relationship to one another, described above may be substantially altered by those skilled in the art to achieve substantially the same functions. These and other changes and modifications which are obvious to those skilled in the art are intended to be included within the scope of the present invention.

What is claimed is:

1. A memory device comprising:
   a plurality of primary memory arrays, each having a plurality of memory cells arranged in a first matrix formation, wherein rows and columns of said first matrix formation are coupled to first row decoders and first sense amplifiers;
   a redundancy memory array having a plurality of redundancy memory cells arranged in a second matrix formation, wherein rows and columns of said second matrix formation are coupled to second row decoders and second sense amplifiers, said redundancy array being subdivided into n sub-arrays, wherein n is greater than or equal to 3; and
   means for replacing a defective one of said primary memory arrays with at least 2 and no more than n−1 of said redundancy memory sub-arrays, corresponding ones of said second row decoders, and corresponding of said second sense amplifiers.

2. The memory device recited in claim 1, wherein each of said redundancy memory sub-arrays has a smaller number of said memory cells than the number of said memory cells in said primary memory array.

3. The memory device recited in claim 1, wherein said at least 2 and at most n−1 of said n redundancy memory sub-arrays replacing a defective one of said primary memory arrays have an equal or larger number of said memory cells integral to said first matrix.

4. The memory device recited in claim 1, wherein said at least 2 of said redundancy memory sub-arrays share said second row decoders and said second sense amplifiers.

5. The memory device recited in claim 1, wherein at least 2of said primary memory sub-arrays include a different number of said rows and said columns.

6. The memory device recited in claim 1, wherein at least 2of said redundancy memory sub-arrays include a different number of said rows and said columns.

7. The memory device recited in claim 1, wherein said primary memory sub-arrays and at least one of said redundancy memory sub-arrays share column circuitry comprising a plurality of column decoders coupled to said primary memory arrays and to at least one of said redundancy memory sub-arrays.

8. A memory device comprising:
   m primary memory units comprising, wherein m is greater than or equal to 1;
   memory blocks, each having a plurality of memory cells arranged in a first matrix formation, wherein rows and columns of said first matrix formation are coupled to first row decoders and first sense amplifiers;
   a redundancy memory array having a plurality of redundancy memory cells arranged in a second matrix formation, said redundancy array being subdivided into n sub-arrays, wherein n is greater than or equal to 3, wherein rows and columns of said second matrix formation are coupled to second row decoders and second sense amplifiers;
   a column circuit means including column decoders coupled to said plurality of memory arrays and to said redundancy memory sub-arrays; and
   means for replacing a defective one of said plurality of memory arrays with at least 2 and no more than m(n−1) of m×n of said redundancy memory sub-arrays, corresponding ones of said second row decoders and corresponding ones of said second sense amplifiers.

9. The memory device recited in claim 8, wherein said means for replacing a defective one of said memory arrays with at least two and at most n−1 of said n redundancy memory sub-arrays are controlled by a redundancy control circuit.

10. The memory device recited in claim 9, wherein said redundancy control circuit further comprises a plurality of fuse latches, each comprising a programmable fuse, wherein the programming of said fuse is indicative of an address of a defective one of said memory arrays to be repaired with at least one of said redundancy memory arrays.

11. The memory device recited in claim 10, wherein said fuse latch further comprises a first passing means for coupling the address input to an output of said fuse latch when said fuse is not programmed, and a second passing means for coupling a complementary address input to said output of said fuse latch when said fuse is programmed.

12. The memory device recited in claim 11, wherein said redundancy control circuit further comprises an AND gate coupling a plurality of said memory latch outputs coupled to said first and second passing means to generate an enabling signal that activates at least one of said redundancy memory cells within said redundancy memory arrays.

13. The memory device recited in claim 12, wherein said redundancy control circuit AND gate further generates a signal for disabling at least one memory cell within said memory arrays.

14. The memory device recited in claim 13, wherein said enable signal and said disable signals control a column decoder.

15. A method of repairing a memory device comprising the steps of:
   providing a plurality of primary memory arrays, each having a plurality of memory cells arranged in a first matrix formation, wherein rows and columns of said first matrix are coupled to first row decoders and first sense amplifiers;

providing a redundancy memory array having a plurality of redundancy memory cells arranged in a second matrix formation, said redundancy array being subdivided into n sub-arrays, wherein n is greater than or equal to 3, wherein rows and columns of said second matrix formation are coupled to second row decoders and second sense amplifiers; and replacing a defective one of said primary memory arrays with at least 2 and no more than n−1 of said redundancy memory sub-arrays, corresponding ones of said second row decoders and corresponding ones of said second sense amplifiers.

16. The method recited in claim 15, wherein each of said redundancy memory sub-arrays has a smaller number of said memory cells than the number of said memory cells in said primary memory array.

17. The method recited in claim 15, wherein said at least 2 and at most n−1 of said n redundancy memory sub-arrays replacing a defective one of said primary memory arrays have an equal or larger number of said memory cells integral to said first matrix.

18. The method recited in claim 15, wherein said at least 2 of said redundancy memory sub-arrays share said second row decoders and said second sense amplifiers.

19. The method recited in claim 15, wherein at least 2 of said redundancy memory sub-arrays include a different number of said rows and said columns.

20. The method recited in claim 15, wherein at least 2 of said redundancy memory sub-arrays include a different number of said rows and said columns.

21. The method recited in claim 15, wherein said primary memory sub-arrays and at least one of said redundancy memory arrays share column circuitry comprising a plurality of column decoders coupled to said primary memory arrays and to at least one of said redundancy memory sub-arrays.

22. A method of repairing a memory device comprising the steps of:

providing m memory units, each of said memory units comprising:

a plurality of memory arrays, each having a plurality of memory cells arranged in a first matrix formation, wherein rows and columns of said first matrix formation are coupled to first row decoders and first sense amplifiers;

a redundancy memory array having a plurality of redundancy memory cells arranged in a second matrix formation, wherein rows and columns of said second matrix formation are coupled to second row decoders and second sense amplifiers, said redundancy array being subdivided into n sub-arrays, wherein n is greater than or equal to 3; and a column circuit means including column decoders coupled to said plurality of memory arrays and to said redundancy memory sub-arrays within each of said memory units; and replacing one of said plurality of memory arrays by a combination of at least 2 and no more than m×(n−1) of said m×n redundancy memory sub-arrays, corresponding ones of said second row decoders and corresponding ones of said second sense amplifiers.

23. The method recited in claim 15, wherein said step of replacing a defective one of said memory sub-arrays with at least two and at most n−1 of said n redundancy memory arrays is controlled by a redundancy control circuit.

24. The method recited in claim 23, wherein said redundancy control circuit further comprises a plurality of fuse latches, each comprising a programmable fuse, wherein the programming of said fuse is indicative of an address of a defective one of said memory arrays to be repaired with at least one of said redundancy memory sub-arrays.

25. The method recited in claim 24, wherein said fuse latch further comprises a first passing means for coupling the address input to an output of said fuse latch when said fuse is not programmed, and a second passing means for coupling a complementary address input to said output of said fuse latch when said fuse is programmed.

26. The method recited in claim 25, wherein said redundancy control circuit further comprises an AND gate coupling a plurality of said memory latch outputs coupled to said first and second passing means to generate an enabling signal that activates at least one of said redundancy memory cells within said redundancy memory arrays.

27. The method recited in claim 26, wherein said redundancy control circuit AND gate further generates a signal for disabling at least one memory cell within said memory arrays.

28. The method recited in claim 27, wherein said enable signal and said disable signals control a column decoder.

* * * * *